United States Patent [19]

Ibuka et al.

[11] Patent Number: 5,180,692
[45] Date of Patent: Jan. 19, 1993

[54] METHOD FOR THE MANUFACTURE OF BORON-CONTAINING FILMS BY CVD OR EPITAXIAL TECHNIQUES USING BORON TRIFLUORIDE

[75] Inventors: Shigehito Ibuka, Kofu; Hideki Lee, Nirasaki, both of Japan

[73] Assignee: Tokyo Electron Limited, Tokyo, Japan

[21] Appl. No.: 781,669

[22] Filed: Oct. 24, 1991

Related U.S. Application Data

[63] Continuation of Ser. No. 504,699, Apr. 5, 1990, abandoned, which is a continuation of Ser. No. 330,269, Mar. 29, 1989, abandoned.

[30] Foreign Application Priority Data

Mar. 30, 1988 [JP] Japan ................................ 63-77231

[51] Int. Cl.$^5$ ..................... H01L 21/00; H01L 21/02; C23C 11/00
[52] U.S. Cl. .................................. 437/240; 437/235; 437/238; 148/DIG. 118; 427/99
[58] Field of Search ............... 437/240, 982, 235, 238; 148/DIG. 133, DIG. 118; 427/99

[56] References Cited

U.S. PATENT DOCUMENTS 4,557,950 12/1985 Foster ................................. 437/233
4,624,862 11/1986 Yang et al. ........................... 437/81
4,717,585 1/1988 Ishihara .............................. 437/233

FOREIGN PATENT DOCUMENTS 0107003 6/1985 Japan .

OTHER PUBLICATIONS

Wolf, S., Silicon Processing for the VLSI Era, vol. 1, Lattice Press, 1986, pp. 133–136, 168–170, 177, 182–184, 190.

Primary Examiner—Brian E. Hearn
Assistant Examiner—B. Everhart
Attorney, Agent, or Firm—Oblon, Spivak, McClelland, Maier & Neustadt

[57] ABSTRACT

This invention relates to a method for forming a boron-containing film of high quality on the surfaces of semiconductor wafers by CVD or epitaxial techniques using reaction gases including at least boron trifluoride.

6 Claims, 2 Drawing Sheets

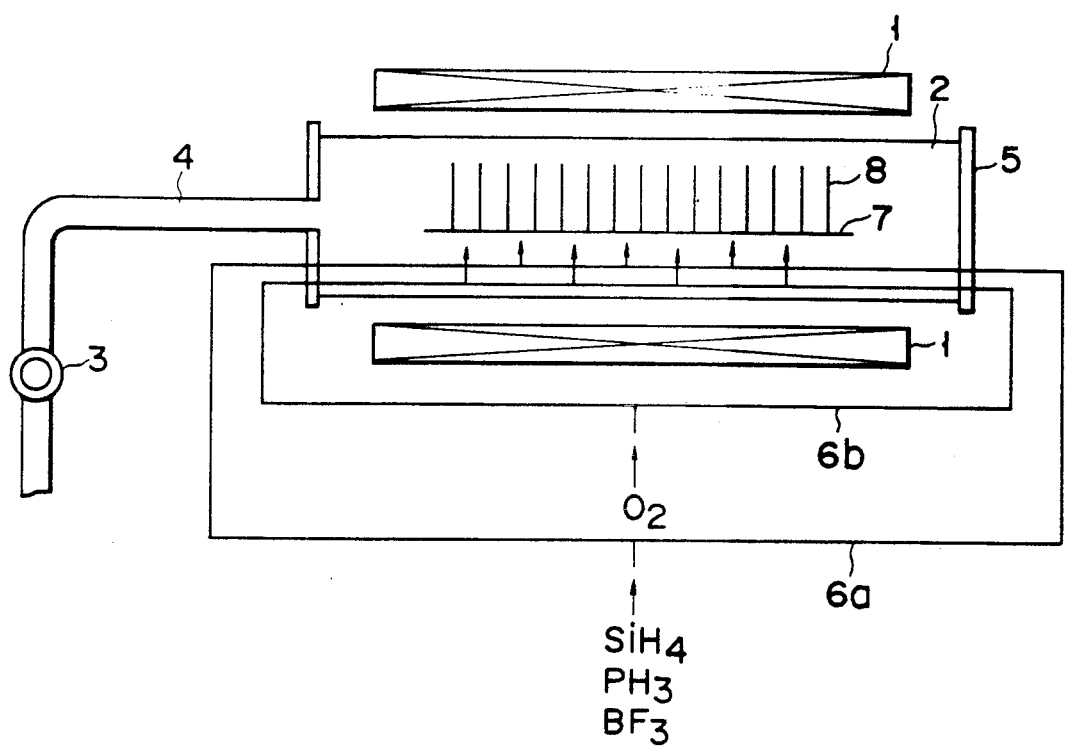
F I G. 1

METHOD FOR THE MANUFACTURE OF BORON-CONTAINING FILMS BY CVD OR EPITAXIAL TECHNIQUES USING BORON TRIFLUORIDE

This application is a continuation of application Ser. No. 07/504,699, filed on Apr. 5, 1990, now abandoned which is a continuation of Ser. No. 07/330,269 filed Mar. 29, 1989, now abandoned.

BACKGROUND OF THE INVENTION

1. Field of the Invention

This invention to a method for the manufacture of boron-containing films.

2. Description of the Related Art

In the manufacture of semiconductor devices, CVD (Chemical Vapor Deposition) and epitaxial techniques are used to form a thin film on substrates which include semiconductor wafers.

By the use of these techniques, a boron-containing film for example, such as a BPSG film or a BSG film, is grown on the substrates such as semiconductor wafers. For this purpose, conventionally, diborane ($B_2H_6$) is used as a boron source gas and a boron-containing film is formed by the atmospheric pressure CVD process.

Compared with the atmospheric pressure CVD process, the low pressure CVD process, though slower in film forming speed, enables a good-quality film with less pinholes to be formed. When the low pressure CVD systems slow in film formation are used, batch processing which treats several tens to hundreds of wafers at a time is most prevalent. In the low pressure CVD systems, the hot-wall heating system for heating the whole reaction furnace is the dominant heating system, In some cases, it is desirable to form a boron-containing film by the low pressure CVD process described above.

In the conventional method for forming a boron-containing film, however, diborane having a low decomposition temperature is used as a boron source gas. Therefore, when a film is formed by a low pressure CVD process of the hot wall type, diborane decomposes into boron and hydrogen the moment it enters the reaction furnace. As a result, boron is unable to be introduced into the film and a desired film cannot be obtained. Diborane is liable to decompose and decomposes while in storage. Thus, it is difficult to control its concentration and maintain the boron concentration of a film to be formed to a desired value.

Use of boron trichloride as a boron source gas is under consideration. However, the hygroscopicity of boron trichloride makes it difficult to form a film of good quality, Another problem with boron trichloride is its high toxicity, which makes its handling obviously dangerous.

SUMMARY OF THE INVENTION

The object of this invention is to provide a method for the manufacture of a boron-containing film by which boron can be distributed uniformly throughout the film and a film of high quality and with a uniform thickness can be formed easily.

In the method of the present invention, objects to be processed are brought into a reaction chamber, and reaction gases are supplied into heated atmosphere in the reaction chamber. The method is featured by comprising the step of supplying reaction gases including at least boron trifluoride into the reaction chamber, thereby forming the boron-containing films on the object.

According to the film forming method of this invention, boron-containing films, such as a BPSG film, a BSG film and a boron-doped polysilicon film, are formed using boron trifluoride ($BF_3$) as a boron source gas and employing such techniques as atmospheric pressure CVD, low pressure CVD, plasma CVD and epitaxial growth.

When a high temperature oxide film (e.g. a BSG film or a BPSG film) is formed by a CVD technique, $SiH_4$, $Si_2H_6$, $SiH_2Cl_2$ or $SiCl_4$ is used as a Si source gas, $POCl_3$ or $PH_3$ as a P source gas and $N_2O$ or NO as an $O_2$ source gas.

To form a low temperature oxide film (a BSG film or a BPSG film) for example by employing a CVD technique, $SiH_4$, $Si_2H_6$, $SiH_2Cl_2$ or $SiCl_4$ is used as a silicon source gas, $POCL_3$ or $PH_3$ for example as a phosphorus source gas and $O_2$ as an oxygen source gas.

To form BSG film or a BPSG film by a CVD technique using $(C_2H_5O)_4$Si (tetraethoxysilane), $(C_2H_5O)_4$Si gas is used as a silicon source gas, $(CH_3)_3P$, $(CH_3)_3OP$, $(CH_3)_3OP$, $(CH_3O)_3OP$, $PH_3$ or $POCl_3$ is used as a phosphorus source gas and $O_2$, $N_2O$ or NO as an oxygen source gas.

To form a silicon film doped with boron (or phosphorus), silicon is supplied from $SiH_4$ gas or phosphorus is obtained from $PH_3$ or $POCl_3$ gas.

When epitaxial growth is employed, $BF_3$ gas is used together with $SiH_4$ gas which is a silicon source.

Compared with diborane, boron trifluoride is stabler and has a higher decomposition temperature and therefore its concentration can be controlled easily. This makes it possible to achieve a desired boron concentration in the deposited film. When boron trifluoride is used, a film can be deposited using low pressure CVD, which uses an elevated film forming temperature. Further since this gas is less toxic, there is less danger in its handling.

BRIEF DESCRIPTION OF THE DRAWINGS

FIG. 1 is a drawing for explaining an apparatus for manufacture of boron-containing films, used in an embodiment of this invention;

DETAILED DESCRIPTION OF THE PREFERRED EMBODIMENTS

Figure 2A:
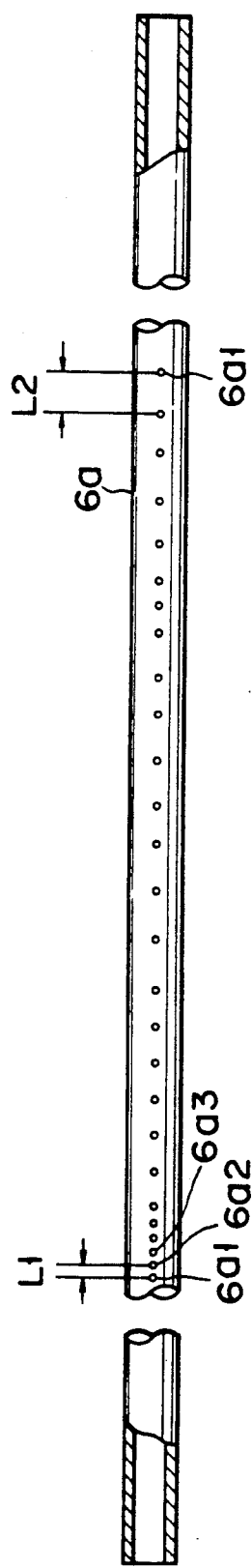
FIG. 2A is a drawing for explaining the arrangement of gas supply ports of a gas supply pipe for $SiH_4$, etc.

FIG. 1 shows an example of an apparatus for manufacture of boron-containing films, used in an embodiment of this invention. The numeral 1 indicates heating means disposed at the horizontal type outside reaction pipe 2 made of quartz and reaction pipe 2 is accommodated in a heating furnace, not shown. Exhaust pipe 4 having exhaust device 3 inserted therein is connected to one end of reaction pipe. An opening for loading and unloading wafers is formed at the other end of reaction pipe 2. This opening is adapted to be closed by cover 5 during reaction. In this case, a vertical type reaction pipe may be also used.

Figure 2B:
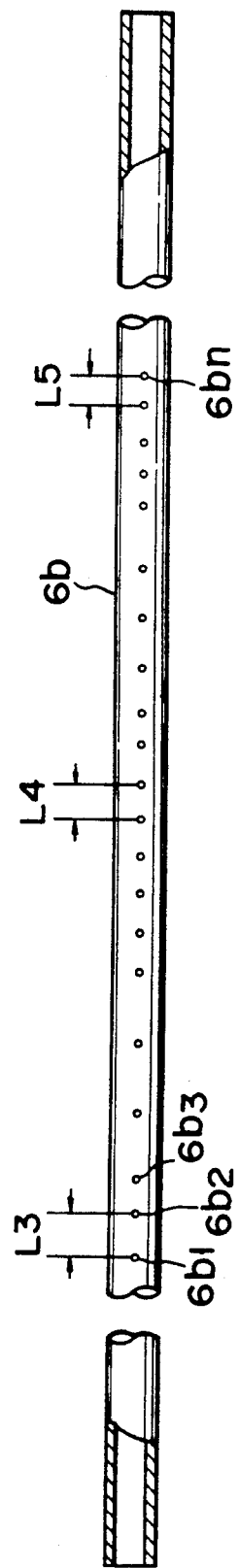
FIG. 2B is a drawing for explaining the arrangement of gas supply ports of a gas supply pipe for $O_2$, etc.

Two gas supply pipes 6a and 6b are provided in such a way as to run in the longitudinal direction of reaction pipe 2. A plurality of gas supply ports 6al through 6an and 6bl through 6br are formed at specified intervals in the longitudinal direction of gas supply pipes 6a and 6b, respectively. The gas supply ports are provided so as to be able to supply a specified type of gas into reaction pipe 2. To be more specific, gas supply ports 6a1 through 6an of gas supply pipe 6a for supply of $SiH_4$, for example, are arranged such that the port intervals are narrow (L1) toward cover 5 and are wide (L2) on the side of exhaust pipe 4 as shown in FIG. 2A. The arrangement of gas supply ports 6b1 through 6bn of gas supply pipe 6b for supply of $O_2$, for example, is such that the port intervals are relatively narrow at both end portions and the central portion (L3, L4 and L5) of the pipe as shown in FIG. 2B.

Using apparatus 10 described above, a boron-containing film is deposited on wafers 8 as follows.

A hundred wafers 6" in diameter are arranged on wafer boat 7. This wafer boat 7 is brought into reaction pipe 2 by a technique of so-called softlanding. The temperature in reaction pipe 2 is raised by heaters 1 to 430° C. Then, exhaust device 3 is operated to set the pressure in reaction pipe 2 to 0.2 Torr. Gases are supplied into reaction pipe 2 through gas supply pipe 6a under the condition that, e.g., 60 SCCM for $SiH_4$ gas, 80 SCCM for 5%$PH_3$/Ar gas and 48 SCCM for $BF_3$ gas. $O_2$ gas is supplied through gas supply pipe 6b at the rate of 90 SCCM.

In this manner, a boron-containing film is deposited on the surfaces of wafers 8. The boron-containing film thus formed has a phosphorus concentration of 3.9 wt % and a boron concentration of 2.7 wt % and is about 5000 Å in thickness.

In this case, the phosphorus and boron concentrations are the averages of the measured values for 100 wafers (measured at 500 points); measurements were made on each wafer at the central point and the other four points lying on the straight lines that intersect at right angles at the central point and being about 21 mm away from the perimeter of wafer 8. The variation in phosphorus concentration ranges from 3.8 wt % to 4.7 wt %. The variation in boron concentration ranges from 2.8 wt % to 3.5 wt %.

The variation in the thickness of the boron-containing film is ±4.9% in the surface of a piece of semiconductor wafer 8 and +2.6% among semiconductor wafers 8. The variation in the film thickness between different batches, each batch consisting of 100 wafers, is less than +0.04%. The film thickness was measured at five points, including the center, of each semiconductor wafer 8 just as in the concentration measurements described above. The four points other than the center were at the points 10 mm away from the perimeter of semiconductor wafer 8. It has been clarified that the measurements results shown above can be obtained within the limits that the processing temperature is set in the range of 350° C. to 430° C., the pressure in reaction pipe 2 is below 0.3 Torr, the $BF_3$ gas flow rate range is 20 to 70 SCCM, the $SiH_4$ gas flow rate range is 40 to 100 SCCM and the $PH_3$/Ar gas flow rate range is 60 to 120 SCCM.

When a boron-containing film which belongs to the so-called low temperature oxide film is formed by applying the method of this invention, it is desirable to set the conditions including processing temperature within the following ranges:

| | |
|---|---|
| Processing temperature | 350 to 430° C. |
| Processing pressure | 0.05 to 0.30 Torr |
| SiH gas flow rate | 40 to 100 SCCM |
| 5% PH/Ar gas to | 60 to 120 SCCM |
| $BF_3$ gas | 20 to 70 SCCM |

In the above embodiment, this invention is applied to the formation of a film by, a low pressure CVD technique. However, it is of course possible to apply this invention to the formation of boron-containing films by chemical reactions by atmospheric pressure CVD technique, plasma CVD technique and epitaxial deposition technique and batch type treatment.

What is claimed is:

1. A method for manufacturing boron-containing films, comprising the steps of:
    arranging a plurality of semiconductor wafers on a wafer boat such that the surfaces of said wafers to be processed for forming films thereon are exposed;
    housing said wafer boat in a process tube made of quartz;
    exhausting the inside of said process tube to form a vacuum therein;
    heating said wafers in said process tube in a range of 350° C.–430° C.;
    introducing a reaction gas composed of $BF_3$, Si, P and O into said process tube, said reaction gas containing a $BF_3$ gas component of 5.482–19.187 SCCM per square meter of unit surface area of a wafer to be processed;
    allowing said reaction gas to directly react with said wafers; and
    forming borophosphosilicate glass films having resistance to humidity absorption, on said wafers.

2. The method for manufacturing boron-containing films according to claim 1, wherein the internal pressure of the process tube is controlled in a range of 0.2–0.3 Torr.

3. The method for manufacturing boron-containing films according to claim 1, wherein the Si containing component of said reaction gas is selected from the group consisting of $SiH_4$, $Si_2H_6$, $SiH_2Cl_2$, $SiCl_4$, and tetraethoxysilane;
    the P containing component of said reaction gas is selected from the group consisting of $POCl_3$, $PH_3$, $(CH_3)_3P$, $(CH_3O)_3P$, $(CH_3)_3OP$, and $(CH_3O)_3OP$; and
    the O containing component of said reaction gas is selected from the group consisting of $O_2$, $N_2O$, and NO.

4. The method for manufacturing boron-containing films according to claim 3, wherein said reaction gas contains a $PH_3$ gas component of 0.822–1.644 SCCM per square meter of unit surface area of a wafer to be processed.

5. The method for manufacturing boron-containing films according to claim 3, wherein said reaction gas contains a $SiH_4$ gas component of 10.964–27.41 SCCM per square meter of unit surface area of a wafer to be processed.

6. The method for manufacturing boron-containing films according to claim 3, wherein said reaction gas contains an $O_2$ gas component of 24–25 SCCM per square meter of unit surface area of a wafer to be processed.

* * * * *